(12) United States Patent
Turner et al.

(10) Patent No.: US 11,664,172 B2
(45) Date of Patent: May 30, 2023

(54) PERFORMANCE OF CAPACITORS

(71) Applicant: The Research Foundation for The State University of New York, Binghamton, NY (US)

(72) Inventors: James N Turner, Vestal, NY (US); Tara Prasad Dhakal, Vestal, NY (US); Ganesh Sainadh Gudavalli, Johnson City, NY (US); Pravakar Prasad Rajbhandari, Binghamton, NY (US)

(73) Assignee: The Research Foundation for The State University of New York, Binghamton, NY (US)

( * ) Notice: Subject to any disclaimer, the term of this patent is extended or adjusted under 35 U.S.C. 154(b) by 31 days.

(21) Appl. No.: 16/369,810

(22) Filed: Mar. 29, 2019

(65) Prior Publication Data
US 2019/0304708 A1   Oct. 3, 2019

Related U.S. Application Data

(60) Provisional application No. 62/650,318, filed on Mar. 30, 2018.

(51) Int. Cl.
| | |
|---|---|
| *H01G 11/08* | (2013.01) |
| *H05K 1/16* | (2006.01) |
| *H01G 11/36* | (2013.01) |
| *H01G 11/04* | (2013.01) |

(52) U.S. Cl.
CPC ............. *H01G 11/08* (2013.01); *H01G 11/04* (2013.01); *H01G 11/36* (2013.01); *H05K 1/162* (2013.01)

(58) Field of Classification Search
CPC ........ H01G 11/08; H01G 11/04; H01G 11/36; H01G 11/24; H01G 11/28; H01G 11/48; H01G 11/46; H05K 1/162; C01B 32/158; B82Y 30/00
See application file for complete search history.

(56) References Cited

U.S. PATENT DOCUMENTS

| | | |
|---|---|---|
| 7,710,709 B2 | 5/2010 | Min et al. |
| 8,358,110 B2 | 1/2013 | Rouvala et al. |
| 8,379,367 B2 | 2/2013 | Oh et al. |
| 9,406,449 B2 | 8/2016 | Xie et al. |
| 9,805,880 B2 | 10/2017 | Warren et al. |

(Continued)

FOREIGN PATENT DOCUMENTS

CN 105405570 A   5/2015

*Primary Examiner* — Michael P McFadden
(74) *Attorney, Agent, or Firm* — Paul Frank + Collins P.C.

(57) ABSTRACT

A capacitor may be configured with a dielectric laminate disposed on ordered or non-ordered structures. Materials for the dielectric laminate have high dielectric constant and reduce leakage current to increase breakdown voltage of the device. These materials may include titanium dioxide ($TiO_2$) and silicon dioxide ($SiO_2$). In one implementation, the capacitor may reside on a substrate. The capacitor may have structure (e.g., nano-tubes, nano-holes, etc;) disposed on the substrate having a surface area greater than the surface area of the substrate and a laminate conformally coating the structure, the laminate comprising a first layer and a second layer with materials that configure the capacitor with an energy density of at least 60 Wh/Kg.

9 Claims, 16 Drawing Sheets

(56) References Cited

U.S. PATENT DOCUMENTS

| | | | |
|---|---|---|---|
| 2011/0183206 A1* | 7/2011 | Davis | H01M 4/134 |
| | | | 29/623.5 |
| 2011/0217628 A1* | 9/2011 | Martin | H01M 4/8652 |
| | | | 502/159 |
| 2012/0121986 A1* | 5/2012 | Balu | H01M 4/663 |
| | | | 429/231.1 |
| 2012/0193632 A1* | 8/2012 | Toriumi | B82Y 10/00 |
| | | | 257/E29.345 |
| 2013/0069011 A1* | 3/2013 | Thomas | H01B 13/00 |
| | | | 977/932 |
| 2013/0286540 A1* | 10/2013 | Farcy | H01G 4/005 |
| | | | 361/303 |
| 2014/0015548 A1* | 1/2014 | Naughton | G01N 27/3278 |
| | | | 324/658 |
| 2015/0187515 A1* | 7/2015 | Gardner | H01G 11/52 |
| | | | 361/781 |
| 2016/0111564 A1* | 4/2016 | Gidwani | H01L 31/052 |
| | | | 429/434 |
| 2016/0196932 A1* | 7/2016 | Chiem | H01G 11/24 |
| | | | 29/25.03 |
| 2016/0240328 A1 | 8/2016 | Huang et al. | |
| 2018/0159133 A1* | 6/2018 | Schoo | H01G 9/2095 |

* cited by examiner

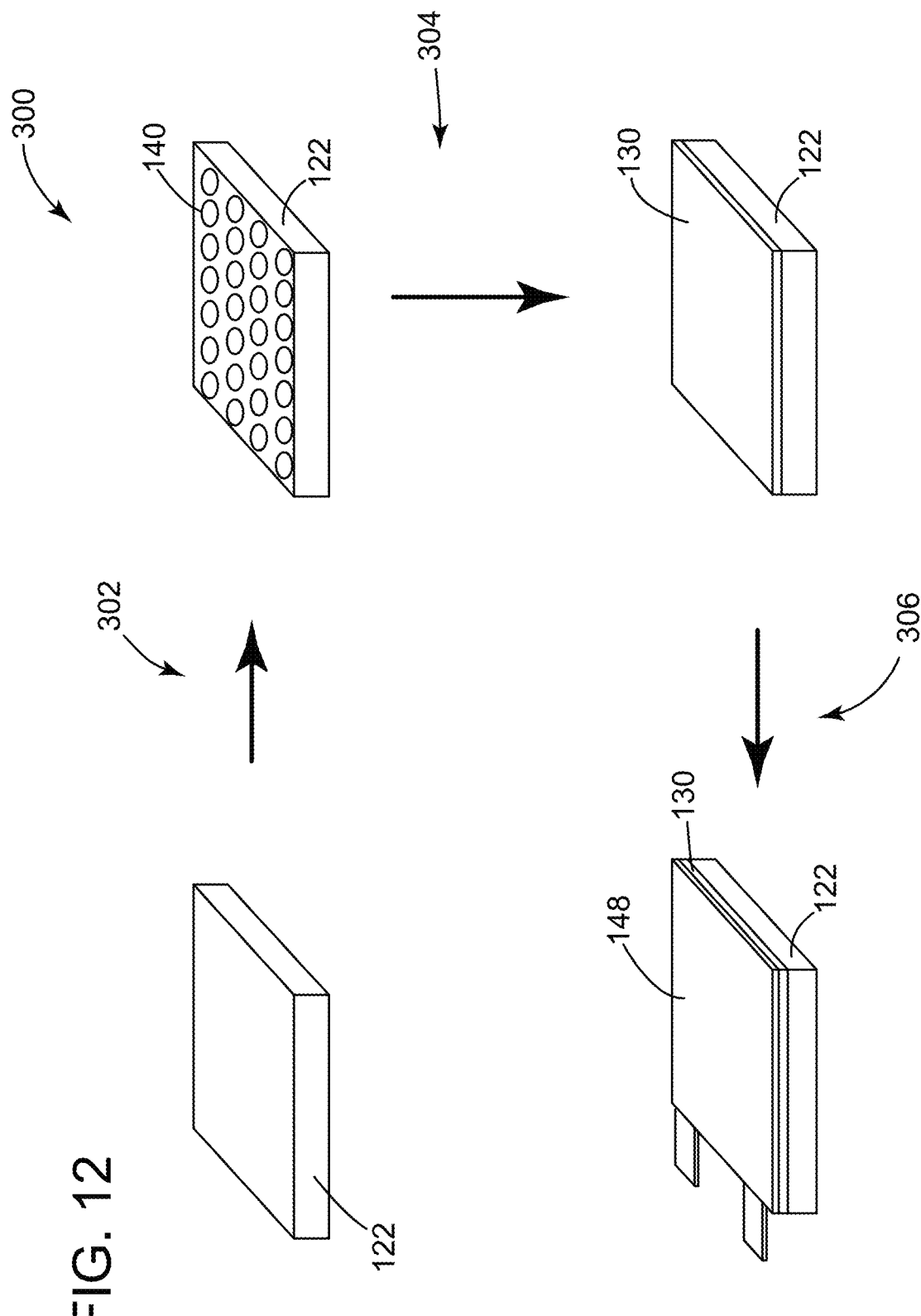

PERFORMANCE OF CAPACITORS

CROSS-REFERENCE TO RELATED APPLICATIONS

This application claims the benefit of priority to U.S. Ser. No. 62/650,318, filed on Mar. 30, 2018, and entitled "IMPROVING PERFORMANCE OF CAPACITORS." The content of this application is incorporated by reference herein in its entirety.

BACKGROUND

Supercapacitors are devices with high power density, moderate energy density, and long, stable life. These properties position these devices to replace or compliment batteries to store and deliver electrical energy for use in electrical circuits, alone or as part of hybrid battery/capacitor devices. Supercapacitors can also serve as discrete components in electronic circuits of all types because of their small footprint. However, most supercapacitors lack sufficient energy density to work in many applications. Batteries therefore remain the most reliable source of stored energy.

SUMMARY

The subject matter of this disclosure relates to improvements in performance of supercapacitors. Of particular interest herein are embodiments with structure that can match or surpass batteries in such properties as storage, energy delivery, and discharge/recharge cycling, among others. As circuit components, the embodiments can optimize these properties to improve footprint and geometric conformity.

The structure may optimize stored energy E according to Equation (1) below:

$$E = \tfrac{1}{2}CV^2.$$  Equation (1)

where, C is capacitance and V is voltage. The embodiments may, for example, employ a dielectric with parameters (e.g., surface area, dielectric thickness, dielectric constant, etc.) to increase capacitance (C). These embodiments may also comprise materials that improve the dielectric breakdown strength to increase voltage (V). In this regard, some embodiments may comprise solid-state electronic components, for example, carbon nano-tubes (CNTs) and a dielectric "nano-laminate" that conformally coats the CNTs. Both the CNTs and the nano-laminate address several key factors to improve capacitance C of the device. The CNTs increase surface area of the embodiments within a given footprint. Material for the nano-laminate forms a stack of alternating layers with properties (e.g., dielectric constant, energy bandgap, Gibbs free energy, thickness, etc.) tailored to achieve very high dielectric constant (k) with low leakage current. These features afford the device with high breakdown voltage that is critical given the $V^2$ dependence of energy density E. The result, in turn, is a thin-film capacitor that marries favorable power density (of capacitors) with energy density comparable to battery storage in a lightweight, flexible, stable device. These properties can also improve operation and application of the capacitors in electronic circuitry. Other embodiments are within the scope of the discussion here.

DRAWINGS

Reference is now made briefly to the accompanying drawings, in which:

FIG. 1 depicts a schematic diagram of an exemplary embodiment of a capacitor;

FIGS. 1A and 1B depict examples of structures that form the base of an electrode comprising a conductor (A) or a non-conductor (B) with very large surface area for use in the capacitor of FIG. 1. FIG. 1A shows the electrode structures in an ordered array. FIG. 1B shows the electrode structures in a non-ordered array;

FIGS. 1C, 1D, and 1E depict examples of structure for a laminate of the capacitor of FIG. 1;

FIG. 12 depicts a flow diagram of an exemplary embodiment of a method to manufacture the capacitor, for example, to manufacture the capacitor with an ordered array of structures of FIGS. 10 and 11.

Figure 1:
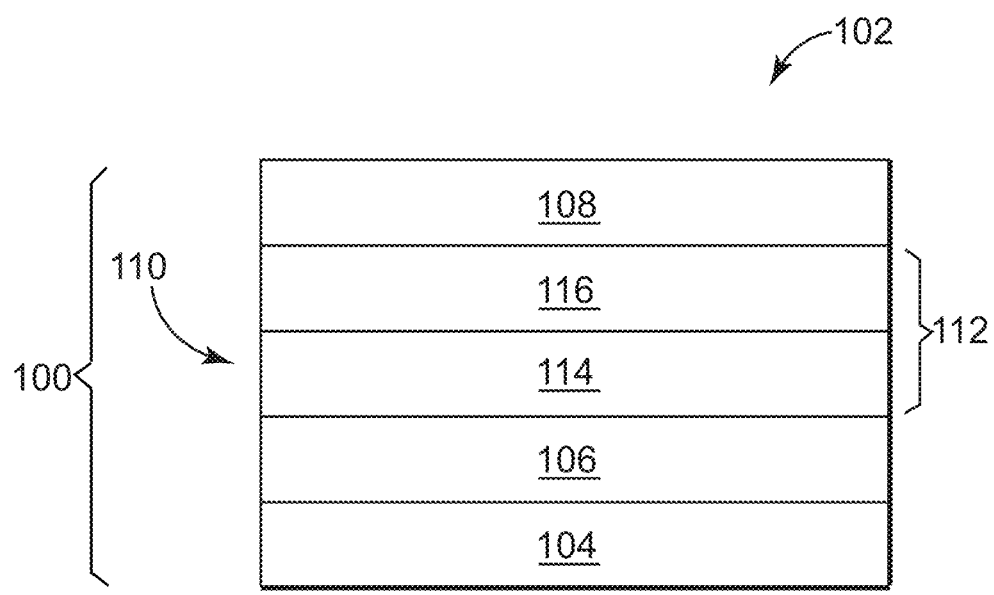

Where applicable like reference characters designate identical or corresponding components and units throughout the several views, which are not to scale unless otherwise indicated. The embodiments disclosed herein may include elements that appear in one or more of the several views or in combinations of the several views. Moreover, methods are exemplary only and may be modified by, for example, reordering, adding, removing, and/or altering the individual stages.

DETAILED DESCRIPTION

Battery storage predominates in most applications because of the high energy density of these devices. The energy density of lead-acid batteries, for example, is about 1080 J/cm$^3$. For better batteries, like lithium thionyl chloride (Li-SOCL$_2$) batteries, the energy density may reach as high as 4,320 J/cm$^3$. For circuitry, capacitors lack sufficient operating parameter optimization and are too large and lack conformability.

Advances in capacitor technology aim to replicate the energy density of batteries. However, no capacitor has yet to exhibit capacitance high enough to match the energy density of batteries or have other properties, like breakdown voltage, necessary to replace battery storage. Thin-film capacitors that use materials with high dielectric constant (k) (e.g., $TiO_2/ZrO_2$ and $Al_2O_3$), for example, may only achieve areal energy densities in a range of from 60 $J/cm^3$ to 400 $J/cm^3$. Material combinations, like $TiO_2/Al_2O_3$, show promise because the dielectric constant is as high as 1000. Other materials, including ceramics like $CaCu_3Ti_4O_{12}$ ("CCTO"), also tend to exhibit very high dielectric constant (k), on the order of ~$10^4$ at room temperature. But these materials still suffer from high leakage current (or "losses") that result in breakdown voltages far too low for the device to operate as a viable replacement for batteries or for many circuit applications.

The discussion that follows describes embodiments that achieve both high energy density and high breakdown voltage. These embodiments exhibit aerial energy density upwards of 35,000 $J/cm^3$, more than two orders of magnitude larger than the aerial energy density consistent with capacitor devices to date. This feature makes the device usable for many applications such as electric automobiles, rapid-charge technologies, and energy harvesting. The proposed capacitor is also much smaller and lighter than most storage medium, like batteries. For use in circuitry or as circuit components, the proposed capacitor offers a light weight, low footprint device that may conform to the geometry around it to provide enhanced embedded ability. Plus, with the proposed capacitors large surface area, improved dielectric constant, and favorable breakdown strength may result in energy density that is higher than, at least, lead-acid batteries.

FIG. 1 depicts a schematic diagram of an exemplary embodiment of a capacitor 100 in very general form. This embodiment is part of a storage device 102 that can store and discharge energy much like batteries and like technology. The storage device 102 may have a substrate 104 that supports the structure of the capacitor 100. This structure may include a pair of electrodes (e.g., a first electrode 106 and a second electrode 108) with a dielectric laminate 110 disposed therebetween. The dielectric laminate 110 may comprise one or more layered "units" 112 that reside between the electrodes 106, 108. The units 112 may comprise material layers (e.g., a first layer 114 and a second layer 116).

Broadly, the capacitor 100 is configured to store energy at densities that rival batteries and related storage medium. These configurations can maximize charge storing surface area, dielectric constant, and breakdown strength while minimizing dielectric thickness according to parallel plate capacitor theory, shown as Equation (2) below:

$$C = \frac{\varepsilon_o k A}{t}, \quad \text{Equation (2)}$$

where, C is capacitance, k is dielectric constant, A is surface area, $\varepsilon_o$ is electric constant, and t is the thickness of the dielectric laminate 110. The result is devices that allow effective tradeoffs between energy storage, specific capacitance, size, and operational electric currents and voltages. The devices may manufacture at scale as part of integrated circuits, as discrete electronic components of any size, and as large scale devices for very high energy storage and buffering applications as might find use on vehicles or commercial energy storage.

The storage device 102 may be configured to store and discharge energy. The proposed devices may have a form factor that offers comparable energy density at significant weight advantages over conventional batteries, which may weigh 50 lbs or more. Such reductions in size and weight may make electronic devices, like radios, laptops, GPS, and even night vision goggles, much more portable and easy to transport. Notably, the storage device 102 may also scale as appropriate for use in circuitry as a circuit component or in vehicles, for large scale storage, and other large scale application. As thin-films, the devices are also very durable. Plus, unlike batteries and electrolyte capacitors, the devices contain no chemicals that are likely to degrade or leak-out over time. These features may prove very useful for military personnel, for example, that may carry several electronic devices into the field, often in harsh conditions or environments (including underwater), for long periods of time and typically without any reliable or ready access to a power source. And, the proposed thin-film devices have a power density to work in situations that require short, intense bursts of power, like cold engine starting. For military use, the power density comports with high-fire discharge that may benefit advances in electromagnetic rail-guns and related weapons technology, which may offer personnel potentially safer alternatives to gunpowder.

The substrate 104 may be configured to promote these form factors. These configurations may include hard materials (e.g., silicon wafers or glass) or flexible substrates made of metals (e.g., Cu, Al, etc.), polyimide, PEEK, conductive polyester, or like plastic or flexible materials. These materials are compatible with various types of electronics devices, including electronics that employ "hard" or inflexible substrates, solid-state or high-speed silicon electronics, hybrid flexible electronics (HFE), or for fully flexible or stretchable electronics.

The electrodes 106, 108 may be configured to receive electric potential that energizes the capacitor 100. These configurations may employ structural units to maximize surface area (A) of the device. The first electrode 106 may comprise structural units to significantly magnify the surface area of the electrode 106 and dielectric stack 110 at minimal cost to overall footprint of the device 102. In one implementation, the electrode 108 will be conformal to the increased area structures and the dielectric stack 110 of electrodes 106. Examples of these structural units may be ordered or non-ordered, of varying sizes, including dimensions in micrometers ("micro-scale") or smaller including nanometers ("nano-scale"), and may accommodate materials that comport with manufacture techniques to scale the device 102 for different applications (e.g., from integrated circuits to vehicles to large scale electrical systems).

Figure 1A:
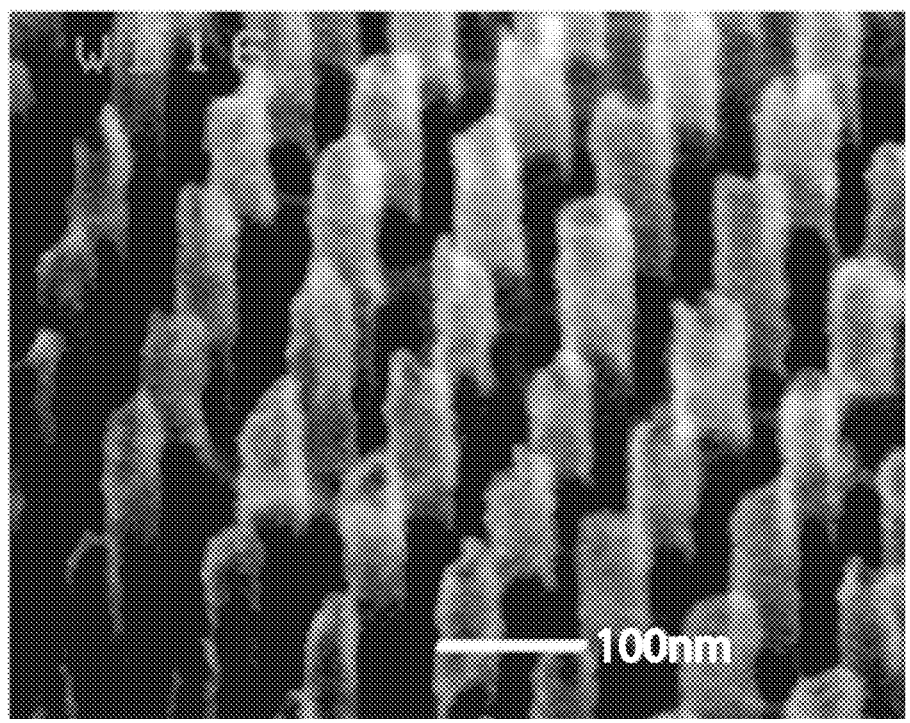
Figure 1B:
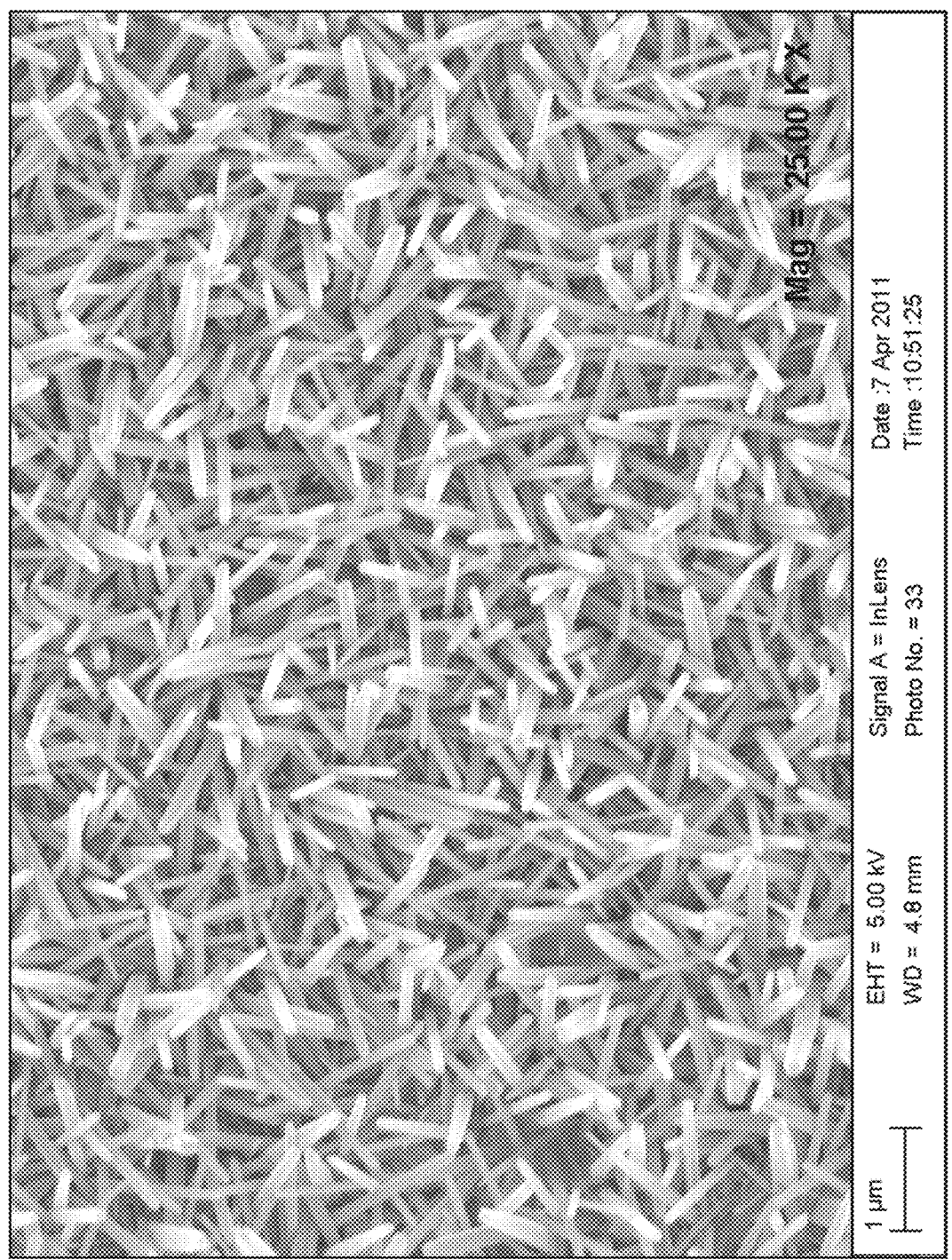

FIGS. 1A and 1B depict images for examples of the structural units. FIG. 1A illustrates an ordered structure, which may comprise carbon nanotubes (CNTs). CNTs often have a tubular form factor that provides electron transport or conductivity. FIG. 1B depicts irregular or non-ordered structures. These examples may include members, for example, elongate tubules. However, these structures may lack consistent spatial arrangement with each other, often overlapping or contacting with adjacent or neighboring members to form a "mesh"-like network on the substrate 104. Care may be given to manufacture both ordered and non-ordered structures to allow material layers (e.g., layers 114, 116) to form a coating of uniform thickness, which is important to optimize capacitor performance. For example, one requirement may be that surface area of materials per footprint area is repeatable to ensure performance parameters are uniform across different areas of the device 102 and from one device 102 to another. For non-conducting structures of electrode 106, a conformal coat may be disposed on the structures, for example, of conducting material, prior to depositing the dielectric laminate 110.

The dielectric laminate 110 may be configured to allow proper energy density of the capacitor 100. These configurations may conformally coat the first electrode 106 at a thickness that comports with structure for the electrodes 106. Generally, the dielectric laminate 110 may comprise any number of materials layers (e.g., layers 114, 116). This disclosure also contemplates that the unit 112 may include any number of material layers, as well. It is also possible for the device 102 to benefit from any number of the layered unit 112. For example, units 112 may be "stacked" to provide a plurality of the material layers 114, 116 on the device 102.

Figure 1C:
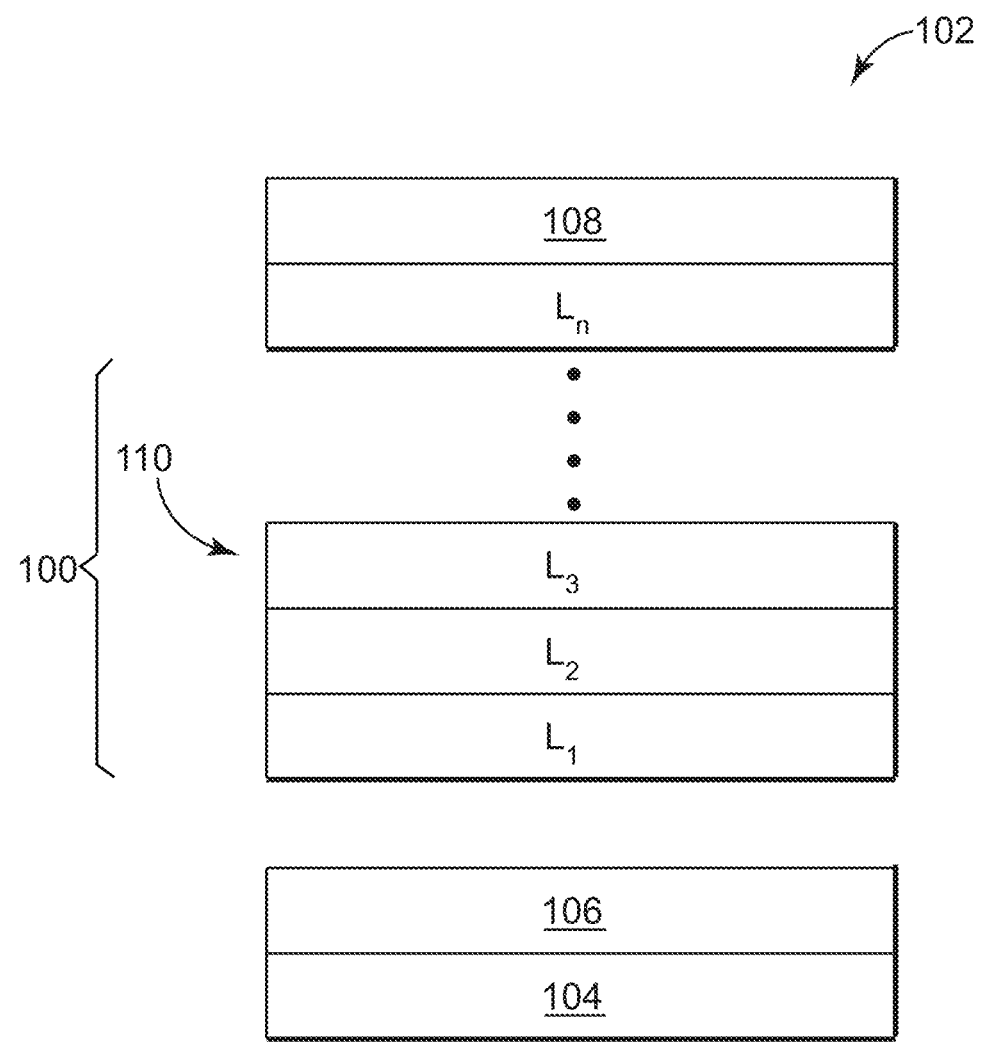
Figure 1D:
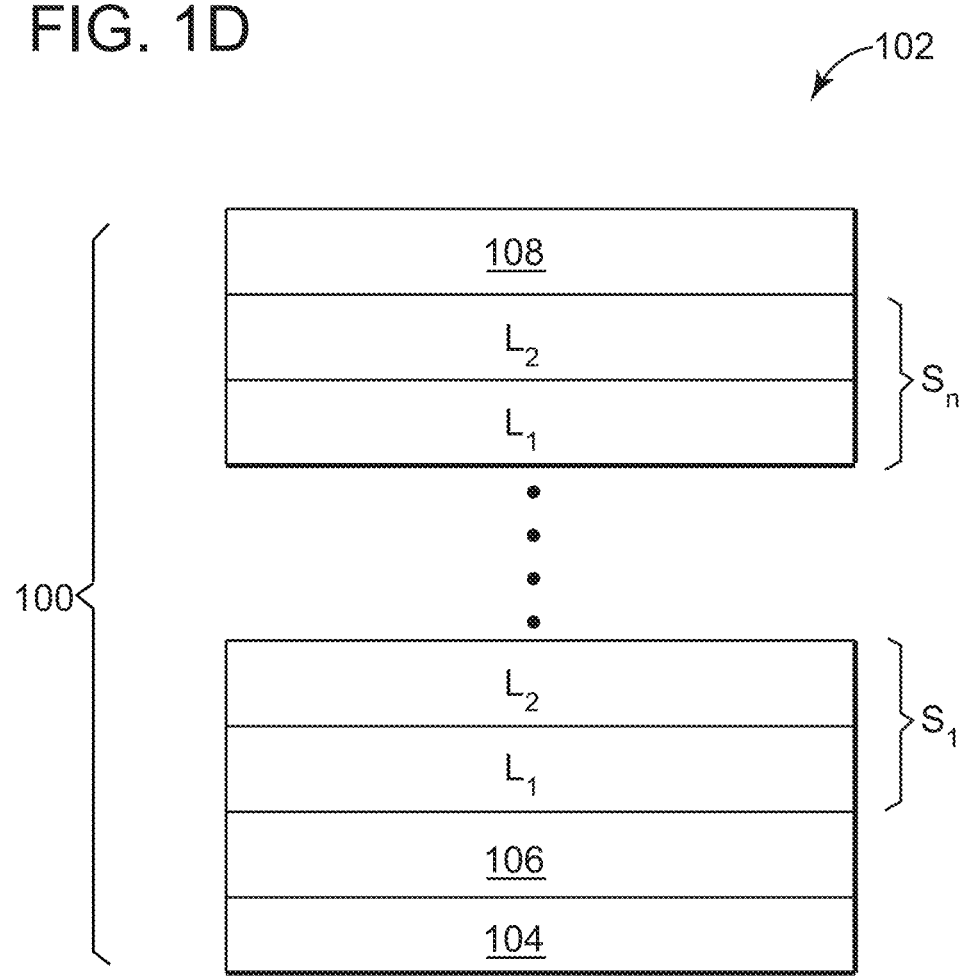
Figure 1E:
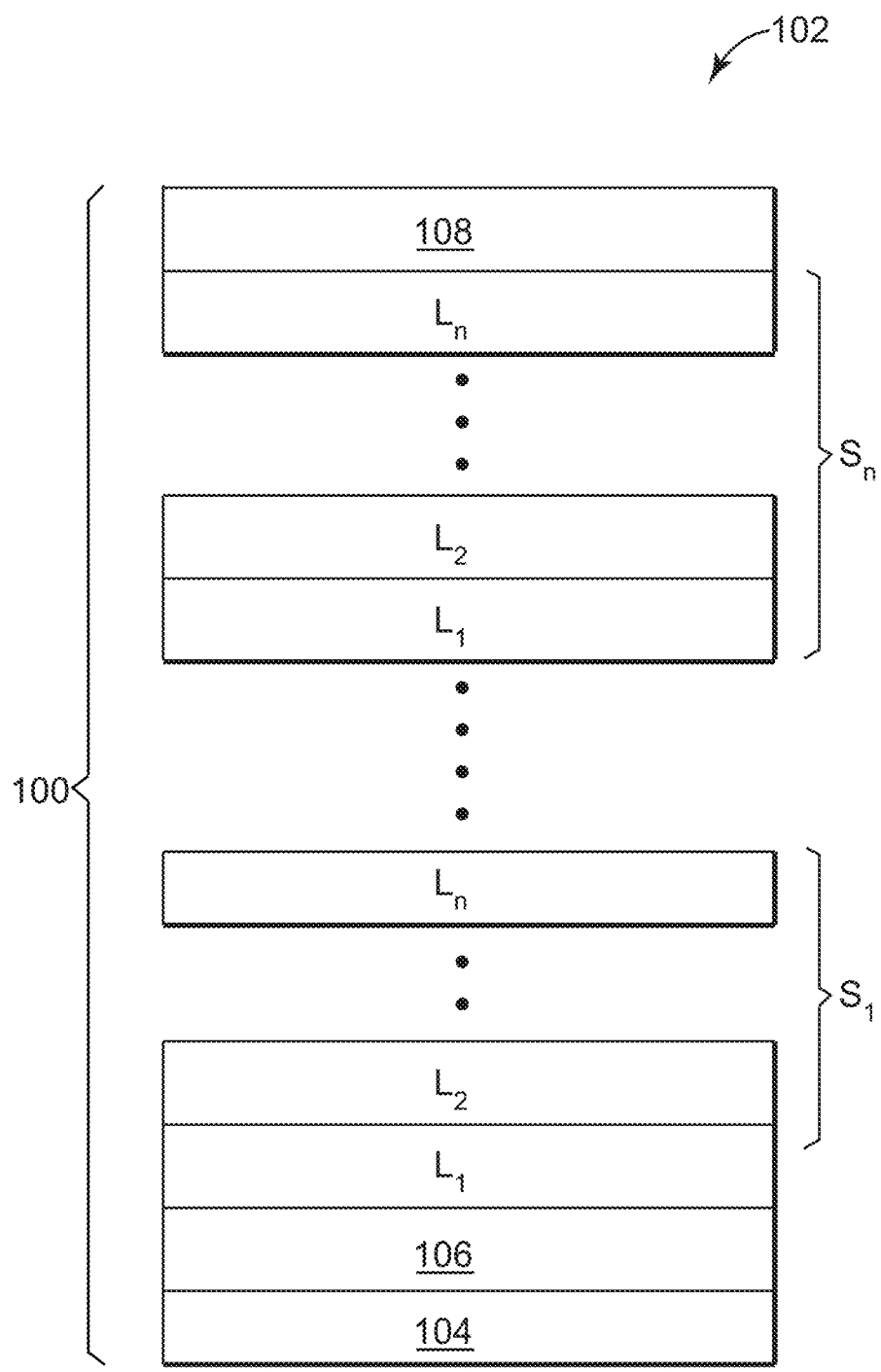

FIGS. 1C, 1D, and 1E depict additional configurations for the construction of the capacitor 100. In FIG. 1C, the construction may include many layers (e.g., $L_1, L_2 \ldots L_n$), which may be of the same or different materials, have the same or different thickness, or have the same or different parameters in general. FIG. 1D shows construction that leverages many units (e.g., $S_1 \ldots S_n$), each having two layers (e.g., $L_1, L_2$). FIG. 1E depicts a construction that leverages many units (e.g., $S_1 \ldots S_n$), where each of the units $S_n$ comprises many layers (e.g., $L_1, L_2 \ldots L_n$). Selection of the number and order of layers within the dielectric laminate 110 may rely on Maxwell-Wagner relaxation (to increase the dielectric constant). Materials for the layers may rely on Gibbs free energy (to lower the leakage current).

Properties for the material layers may benefit the overall characteristics for the device 102. These properties include material as well as dimensions (e.g., thickness). Notably, properties of the material layers may vary independently of each other, as well as independently of other material layers, or other material layers found in other stacked units, as well. This feature may allow for characteristics of the capacitor 100 to vary, effectively to fine tune the storage or circuit device 102 in connection with its application. Some implementations may benefit from very thin individual layers that minimize thickness of the stacked units to maximize specific capacitance. Other implementations may leverage materials with particularly good breakdown characteristics in layers that are thicker or thinner than other materials in the stacked unit(s) to selectively increase the breakdown strength, potentially at cost to specific capacitance.

Any material layers may be configured with materials that favorably influence both the energy density and the breakdown voltage of the capacitor 100. These configurations include dielectric materials, like titanium dioxide ($TiO_2$), aluminum oxide ($Al_2O_3$), and silicon dioxide ($SiO_2$). Other materials include $Si_3N_4$, $SiO_{2-x}N_x$, TiN, $TiO_{2-x}N_x$, $Ta_2O_5$, $SrTiO_3$, $ZrO_2$, $HfO_2$, $HfSiO_4$, $ZnSiO_4$, $La_2O_3$, $Y_2O_3$, a-$LaAlO_3$, $Pr_2O_3$, $Gd_2O_3$, $Lu_2O_3$, $BaTiO_3$, SrO, CaO, BaO, ZnO, and MgO. Suitable materials may have properties that, when in combination, afford the laminate 110 with appropriate high dielectric constant (k) and breakdown voltage. Materials may also exhibit properties, like bandgap, dielectric strength, and Gibbs free energy, that promote lower leakage current, as well. This feature may afford the laminate 110 with better breakdown voltage. Preference may be given to materials that exhibit both high bandgap values (e.g., at or above 9 eV) and high dielectric strength (e.g., at or above 20 MV/cm). The design may also benefit from materials that have similar Gibbs free energy, preferably within 2% of each other.

Figure 2:
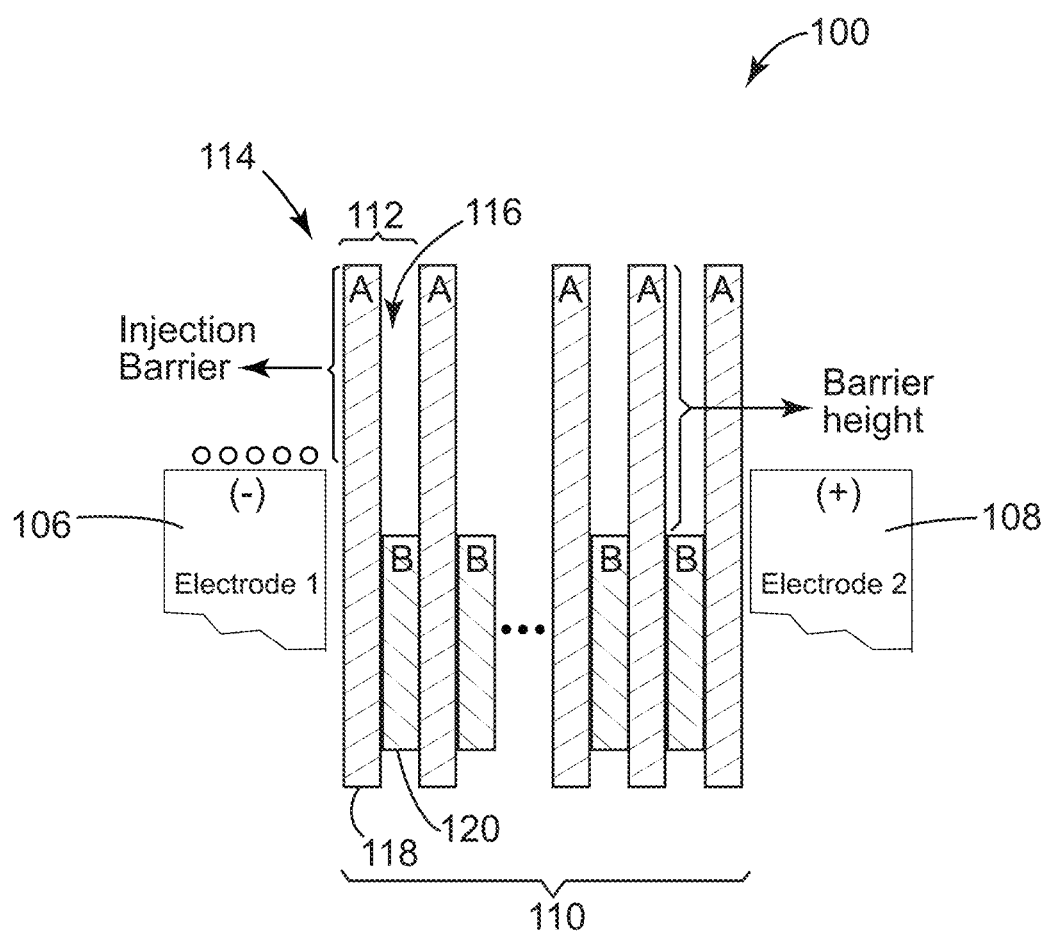
FIG. 2 depicts an energy band diagram of an example of the capacitor of FIG. 1.

FIG. 2 depicts, schematically, an energy band representation of the capacitor 100 to inform discussion of favorable bandgap values. The layers 114, 116 may operate as a barrier 118 and a semi-conductor 120, respectively. The semi-conductor 120 may comprise material having a high dielectric constant (k), like $TiO_2$. Materials for the barrier 118 control leakage current. However, thickness of the laminate 110 must be carefully controlled because, as layers 114, 116 become thinner, they become less insulating mainly due to tunneling that allows charge "hopping" between the semi-conductor 120 in adjacent units 112. This phenomenon may significantly increase leakage current. Probability of tunneling, for example, may be determined in accordance with Equation (3) below:

$$\text{Tunneling Probability} \approx \frac{16E(U_0 - E)}{U_0^2} \exp\left\{-2W\sqrt{\frac{2m^*(U_0 - E)}{\hbar^2}}\right\}, \quad \text{Equation (3)}$$

where, $(U_0-E)$ is barrier height and W is the barrier width. Equation (3) suggests tunneling current at high field gradients may increase in response to changes in dimensions of the barrier 118, typically reductions in barrier width or barrier height. Even if the physical thickness of the layer 118 is very large, the "effective" thickness of the layer 118 that blocks charge injection may be only several nanometers, where a 0.1 eV change in barrier height may result in about 50 MV/m of change in the critical field and a change of dielectric constant by an order of magnitude may change the critical field by about 100 MV/m. High bandgap materials may form the largest energy barrier 118 possible, but still allow for barrier width or the layer thickness that comports with use on nano-structures (e.g., CNTs) for the first electrode 106. $Al_2O_3$ between $TiO_2$ layers, for example, effectively blocks leakage current because of its very high bandgap, 8.8 eV, and favorable resistivity. $SiO_2$ has an even higher bandgap, 9.2 eV, than $Al_2O_3$.

Figure 3:
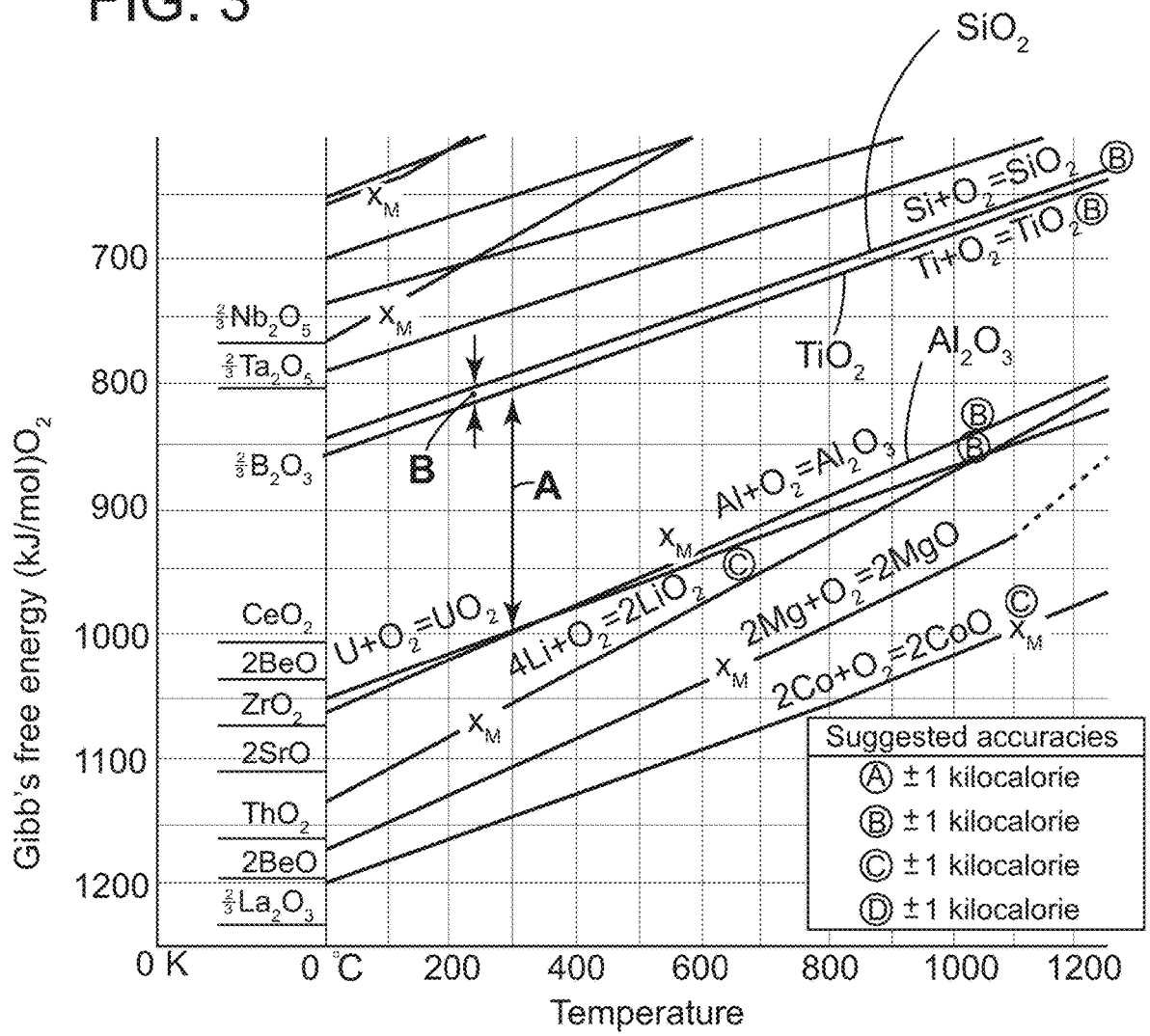
FIG. 3 depicts an Ellingham diagram of Gibbs free energy of materials for use in the capacitor of FIG. 1.

FIG. 3 depicts a plot of Gibbs free energy for various materials, including $Al_2O_3$, $TiO_2$, $SiO_2$. Notably, $SiO_2$ has also has free energy that is much more closely aligned with $TiO_2$ (e.g., within 2% of each other) than $Al_2O_3$ (as indicated by arrow A). This feature may limit oxygen diffusion between $SiO_2/TiO_2$ layers (e.g., layers 114, 116) because of the similarity of energy of formation. By comparison, the very large deviation (indicated by arrow B) between Al oxidation with Ti can lead to oxygen vacancies in the $TiO_2$ layer of an $Al_2O_3/TiO_2$ laminate. These vacancies may promote oxygen diffusion toward $Al_2O_3$ because of its lower free energy for oxidation. This diffusion may be responsible for positive carriers due to Maxwell-Wagner (MW) relaxation (that is responsible for high dielectric constant) that increases conductivity of the $TiO_2$ layer and, thus, may result in severe leakage current. To limit the oxygen diffusion and consequently reduce the leakage current, $SiO_2$ pairs well with $TiO_2$ as $SiO_2/TiO_2$ or with $Al_2O_3/TiO_2$ laminate as $SiO_2/Al_2O_3/TiO_2$. One benefit of the concepts herein is to increase dielectric constant (k) by virtue of MW relaxation and, in turn, mitigate the resulting higher leakage current by pairing materials with similar free energy.

Figure 4:
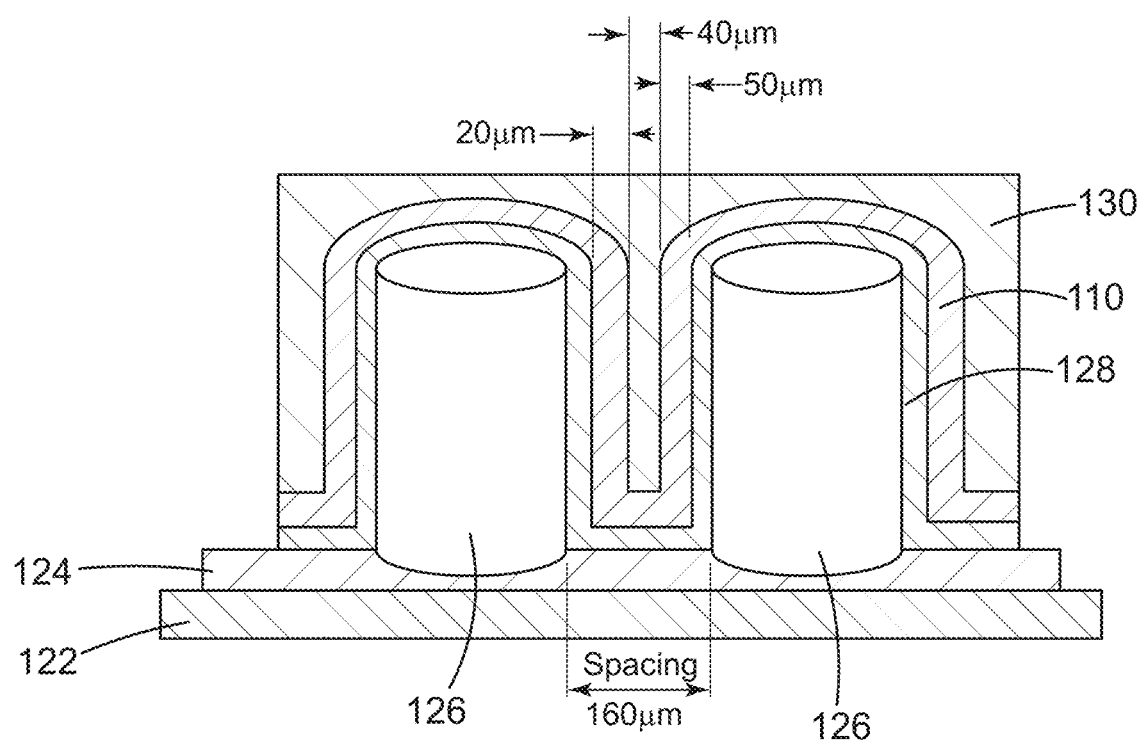
FIG. 4 depicts a schematic diagram of an example of the capacitor of FIG. 1.

FIG. 4 depicts a schematic diagram of an example of the capacitor 100. This example includes a base 122, for example silicon as the base material for the device 102. A supporting layer 124 may reside on the silicon base 122 to prevent cracking. Niobium (Nb) may prove useful for this purpose; although materials with similar thermal expansion coefficient may suffice as well. The first electrode 106 may comprise an array of ordered structures 126, for example, electrically conducting tubules or CNTs that populate the silicon base 122. The design may also benefit from a contact coating 128, like a thin layer of metal (e.g., platinum (Pt)), which interposes between the tubules 126 and the dielectric laminate 110. This thin layer may resolve manufacturing defects that can effect conductivity or adhesion of the dielectric to structures 126 and reduce performance of the device 102. The second electrode 108 may form a top contact 130, also made of platinum (Pt) or like conductive material.

The CNTs 126 may be part of a much larger ordered arrangement (or "array") that covers the base 122. Generally, it benefits the design to size the CNTs 126 for the array to optimize total surface area of the capacitor 100, often in conjunction with steps to optimize deposition of other material layers, including dielectric and conducting materials. Values for total surface area may correspond with Equation (4) below:

$$\text{Total Surface area (cm}^2\text{)} = \frac{1000 \times \pi d h}{(d+T)^2} + 1, \quad \text{Equation (4)}$$

where, d is the diameter of the CNTs 126, T is the total thickness of the layers 110, 128, 130 between adjacent CNTs 126, and h is the height of the CNTs. Equation (4) also includes a "1" to account for an effective area (or footprint) of the silicon base 122. Optimal surface area occurs when spacing D is equal to the diameter d of the CNTs 126. However, aggregate thickness of the layers 110, 128, 130 effectively fixes a minimum for the spacing D (and, thus, (d+T) is the smallest unit length that is repeated in both the x-direction and the y-direction).

Figure 5:
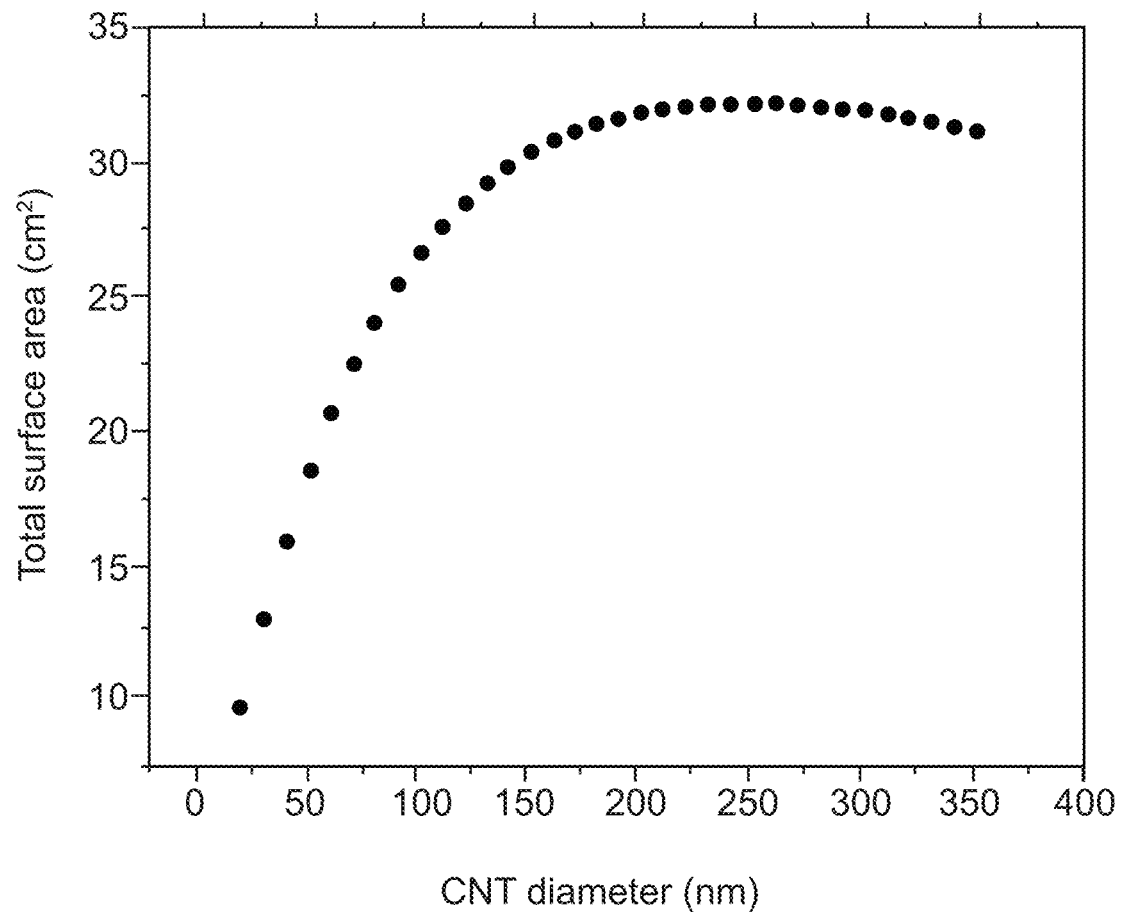
FIG. 5 depicts a plot of structural dimension relating surface area and diameter of a structure (e.g., carbon nano-tubes) that increases the surfaces area for the capacitor of FIG. 4.

FIG. 5 depicts a plot of total surface area as a function of diameter d of the CNTs 126 of FIG. 4. Data for this plot assumes that the thickness of the dielectric is 50 nm. Also, the data assumes spacing D is 160 nm (or the lowest possible spacing D given total thickness T) because the effective area is inversely proportional to the spacing D (or directly proportional to the number of tubes 126). The plot shows that the surface area drops steeply at diameters lower than 160 nm and maximizes around 200 nm.

Figure 6:
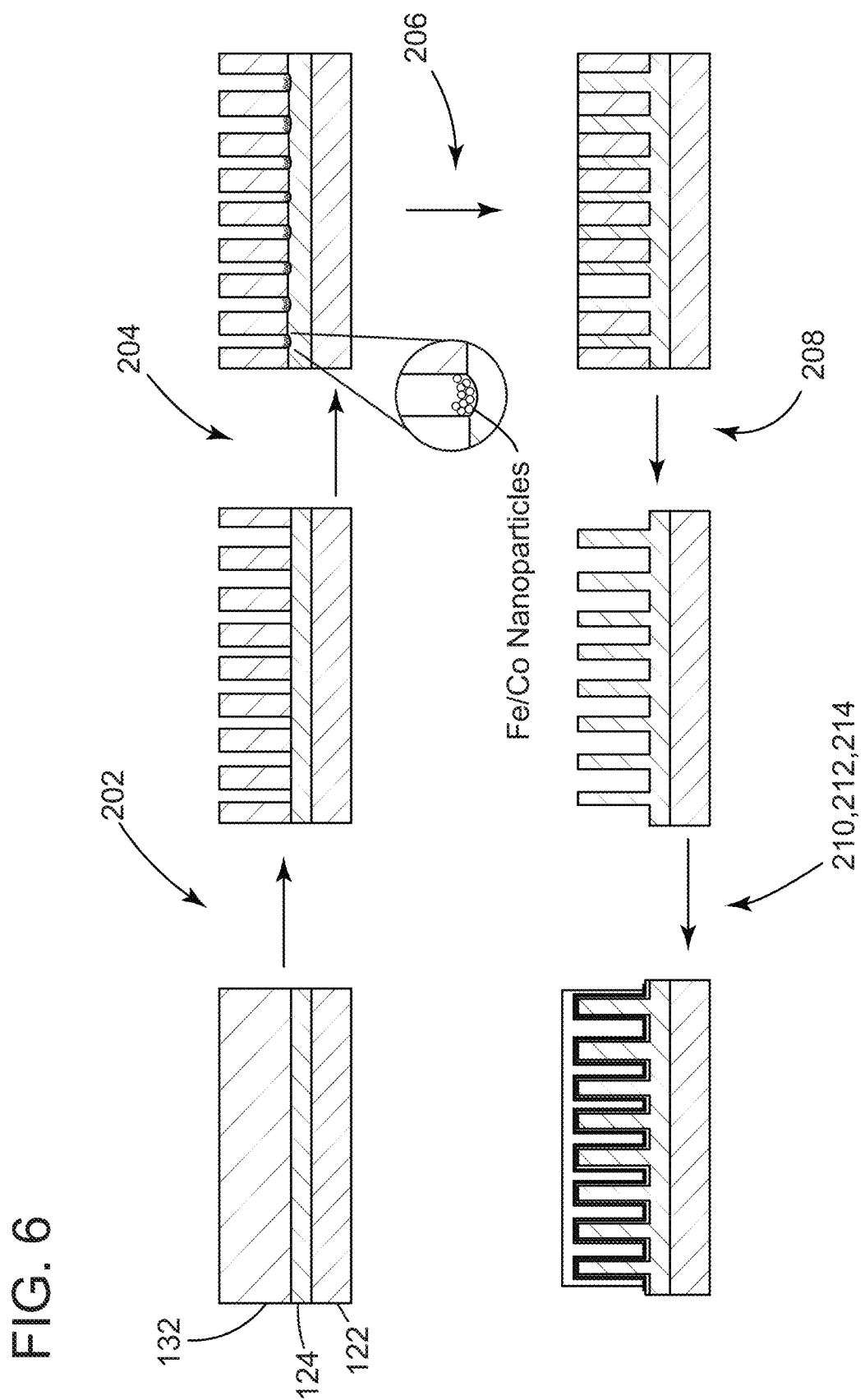
FIG. 6 depicts a flow diagram of an exemplary embodiment of a method to manufacture for use, for example, to manufacture the capacitor with an ordered array of structures of FIGS. 1 and 4.

FIG. 6 depicts a diagram of manufacturing steps for a method 200 that results in an example of the capacitor 100. Generally, this embodiment may result in high-aspect ratio and isolated CNTs 126 grown in an anodized aluminum oxide (AAO) template by chemical vapor deposition (CVD). AAO templates are particularly useful to synthesize nano-wire and nano-tube arrays by oxidation of aluminum in acid electrolyte. The result is a packed array of columnar hexagonal nano-channels perpendicular to the silicon base 122 that feature uniform pore wall thickness. This approach may also facilitate self-assembled structures with high aspect ratios, which are difficult or costly to form using a conventional lithographic process.

At stage 202, an Al film is grown on a silicon substrate. An e-beam evaporator may be useful for this purpose. Since the nanostructure of AAO template affects the orientation and arrangement of CNTs, it is very important to achieve a thermally stable AAO template for high temperature CVD processes. A temperature between 600° C. to 800° C. may be required for the CNT growth. This high temperature may put significant strain on the thin-films. The thin layer 124 of niobium (Nb) may prevent cracking since the thermal expansion coefficient is close to that of alumina. Stability analysis of the AAO templates have revealed that alumina has cracked for substrates without a Nb supporting layer at temperatures from 300° C. to 400° C. The Nb layer 124 also helps make the bottom of nano-channels more conductive which results in lower working voltage for catalyst electrodeposition such as iron (Fe) or cobalt (Co). It is important that the catalyst is only at the bottom of the nano-channel to avoid growth of the CNTs 126 from the sidewalls. At high temperature, Nb oxidizes to $Nb_2O_5$, which is insulating. A pre-thermal treatment at 500° C. in 2% $H_2$ and 98% He reduced the insulating $Nb_2O_5$ formed during anodization to semiconducting $NbO_2$ favoring more conductive pathways for uniform electrodeposition. Highly-doped (100) wafers 122 may be used as substrate 104. This stage may include stages to deposit an aluminum film 132 on the NB layer 124, preferably at a thickness of 100 to 200 μm to allow trenches of 100 to 200 μm depth. This stage may occur on one side of the wafer 122, but additional stages for the other side may benefit the design to allow structure for a second capacitor to form on the substrate 104.

The stages may include stages to anodize the Al layer 132 in oxalic acid. For example, the wafer 122 may be partially dipped into solution, with aluminum as the anode and a platinum plate as the cathode, until all of the aluminum is converted into alumina. This process may be done using a "two-stage" growth process, which may include both mild and hard ionization to form long nano-channels of appropriate length. In one implementation, anodization is stopped when approximately half of the AL layer 132 is consumed. Then the wafer 122 is immersed in a mixture of chromic acid and phosphoric acid (e.g., at 60° C.) to remove porous alumina formed by the prior stage. This second stage leaves behind the footprint for the final template. The remaining Al layer 132 will be anodized using, for example, the same conditions as in the second stage. This stage results in an AAO template with better uniformity and improved nano-channel ordering. The nano-hole diameter can be adjusted by a pore-widening treatment using phosphoric acid. This pore-widening treatment may also help to reduce the thickness of any remaining alumina barrier layer below the bottom tip of the nano-channels, making the base more conductive for catalyst electrodeposition.

The method 200 can be optimized to achieve desired nano-channel depths and diameters. Generally, interpore distance may be proportional to the anodization voltage and the pore depth may be proportional to anodizing time. Processes using high voltage (100-140 V) and higher growth rates (50-100 $\mu m h^{-1}$) when compared to mild anodization (MA) at 25 V (2-6 $\mu m h^{-1}$) may benefit growth of nano-channels, for example, as long as 110 μm by a hard anodization technique (HA). For 200 μm long channels, it will be important to control structural parameters such as pore size, interpore distance, and aspect ratio of nanopores. A protective aluminum oxide layer generated by mild anodization followed by hard anodization (with increase in voltage at a certain rate) has generated highly ordered hexagonal nano-channels.

At stage 204, iron/cobalt (Fe/Co) catalytic nano-particles may be electrodeposited at the bottom of nano-holes. A three-electrode system may be useful for this purpose. This stage may include stages for electrochemically depositing Co nanoparticles of 100-200 nm by AC electrolysis in an electrolyte containing $CoSO_4$, $HBO_3$ and ascorbic acid. This process may form a cluster of Co nanoparticles with high aspect ratio for efficient catalysis. The Co containing AAO templates may be placed in a tube furnace for reduction (e.g., at 600° C. for 1 hour) in a flow of Ar/$H_2$ mixture before starting CNT growth. Some embodiments may also use Fe as a catalyst, where the process will be the same except that the precursor solution will be iron sulfate.

At stage 206, the CNTs 126 may be grown. Water assisted chemical vapor deposition may be useful for this purpose. The stages may include stages for placing the substrate in a quartz tube furnace with Ar and $H_2$ (e.g., at 500 sccm and 10 sccm, respectively) to create an oxygen free environment. The furnace is then heated (e.g., to 800° C.). Once the temperature is maintained, the Ar/$H_2$ mixture and ethylene gas mixture is passed through the chamber, which decomposes on the catalyst and creates supersaturation, resulting in CNT growth. Once the required height is obtained, the ethylene flow and heating is stopped while Ar/$H_2$ flushing is continued. The substrate 122 is removed once it reaches room temperature and treated with mild sulfuric acid to etch residual Fe or Co particles.

The thin alumina at the bottom tip of nano-channels helps as a barrier layer which prevents the Fe/Co nano-particles at high temperature from diffusing into the substrate. This helps decomposition of carbonaceous materials on the catalyst for efficient CNT growth. The AAO template might act as a catalyst media for CNT growth. This may stop the CNT growth once it reaches the edge of AAO template. Thus the CNTs will have the same size and shape as the AAO template.

At stage 208, the method 200 may for etch the aluminum oxide off. This stage may expose the bare CNTs 126 to dilute NaOH solution. Any residual Fe/Co around the CNTs may be removed, for example, with mild sulfuric acid. Etching of the aluminum oxide can be optimized to make sure that the alumina barrier layer at the bottom of the nano-channels is not etched away, thus guaranteeing that the CNTs are intact.

At stage 210, the method 200 may coat the CNTs 126 with the thin layer 128 of platinum (Pt). Electroplating may be useful for this purpose, particularly, with the high-aspect ratio of the CNTs, because traditional metallization methods (e.g., thermal evaporation, sputtering, etc.) may not fully cover the CNT array. This stage may correct certain defects, for example, that may result from "non-perfect" etching of all $Al_2O_3$ that can leave behind a thin layer of $Al_2O_3$ at the bottom of the carbon nano-tubes. This thin layer could prove an obstacle for charge transport, which can limit use of the CNTs 126 as the back electrodes for the capacitor, as they are conducting material. The Pt layer 128 may be useful to operate as the back electrode because this material works well with nano-scale coatings like laminate 110.

At stage 212, the method 200 may grow the conformal, laminate 110 on the CNTs 126. Atomic layer deposition ("ALD") may be useful for this purpose. This process may avoid "hot spots," that can occur in chemical texturization and rolling processes that practices-to-date employ to increase surface area of capacitors. These hot spots may reduce breakdown strength. On the other hand, ALD may deposit the oxide layer(s) uniformly over the CNTs 126 to allow even electric field in all locations to prevent localized hot spots. The uniformity of ALD-deposited layers is also desirable to avoid defects and lower defect density. This feature may avoid trap-assisted tunneling (TAT) or multi-step trap-assisted tunneling (MTAT), both of which may lead to a percolation event that causes electrical breakdown of the insulator at critical defect density. Less defects in the oxide layer(s) can also avoid Fowler-Nordheim tunneling (or "field assisted thermionic emission") that can contribute to leakage by allowing tunneling through the oxide in response to high electric fields (e.g., >$10^7$ V/cm). The oxide layer(s) from ALD can also avoid Poole-Frenkel effects that occur when both defects and high electric fields exist, which can also contribute to leakage because the reduction in potential barrier around the trap state in a high electric field allows trapped electrons to tunnel out from the trap state.

At stage 214, the method 200 may form the top contact 130. Electroplating may be useful for this purpose. However, this process may require a seed layer with a certain conductivity to achieve uniform deposits on non-conducting materials such as the dielectric nano-laminate 110. Electroless plating techniques may also apply for ohmic contacts to n- and p-doped silicon. In one implementation, the stages may include stages for depositing platinum (Pt) (or another metal or conducting material) as the top contact 130 for the capacitor 100. Electroless deposition of porous platinum on alumina may be carried out using precursor such as $PtCl_2(sty)_2$. These films adhere to the substrate very well with tunable sheet resistance of over 5 orders of magnitude. With this process, the Pt nanoparticles assemble themselves into a densely packed, electrically conducting film with nanometer-sized pores, thereby eliminating the need for an additional electrically conducting matrix material.

Figure 7:
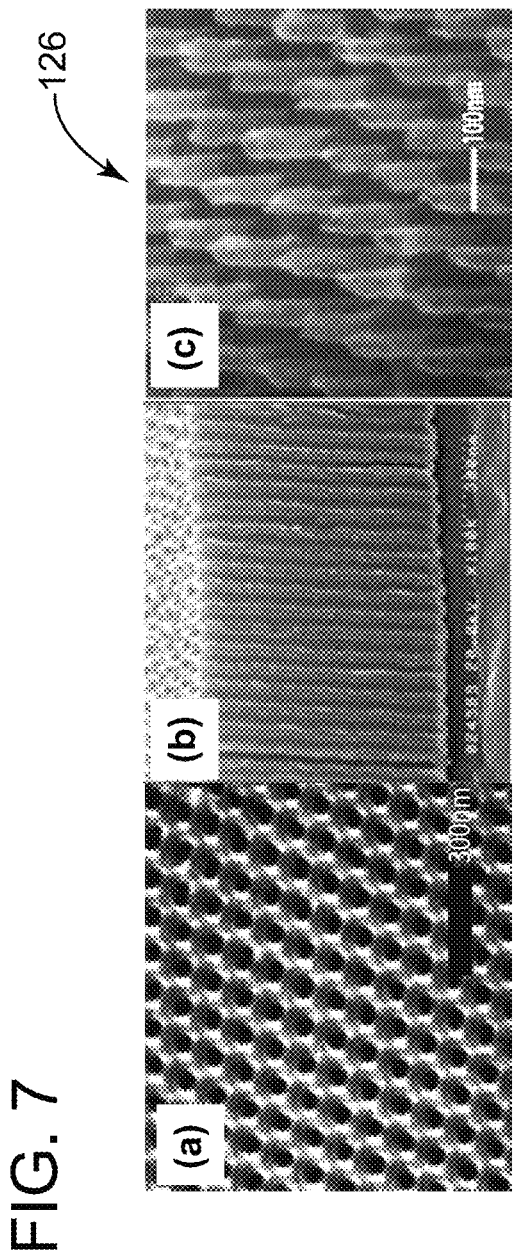
FIG. 7 depicts various images of an example of the fabrication of the capacitor of FIGS. 1 and 6 showing possible template nano-holes in (a) and (b) and structure for carbon nano-tubes in (c)
Figure 8:
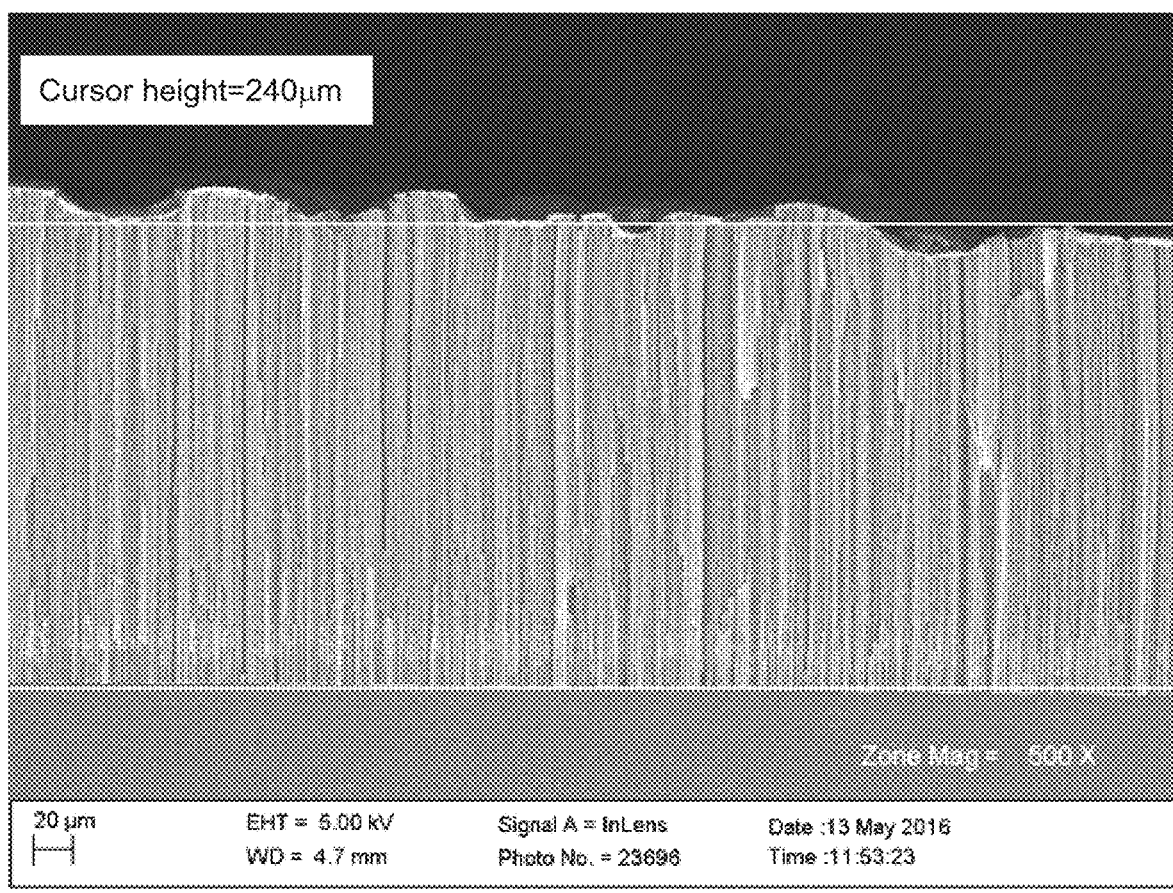
FIG. 8 depicts an image of an example of an ordered array of structures of the capacitor of FIGS. 1 and 6, the structure comprising carbon nano-tubes that are vertically aligned and of about 240 μm in height.

FIGS. 7 and 8 depict images of exemplary structure that may result from use of the method 200 noted above. FIG. 7 shows an arrangement of the CNTs 126 as uniform, well-separated, isolated structures. This arrangement is important to exploit the unique structural and electronic properties of the CNTs 126. Exemplary process may, for example, grow CNTs 126 by the decomposition of ethylene on iron (Fe) or cobalt (Co) catalyst within hexagonal anodized aluminum oxide templates. This process may allow for controllable and scalable growth of the CNTs 126, as well as a precisely packed structure with controllable spacing of the same. FIG. 8 depicts a typical SEM cross-section of CNT film grown with Fe as a catalyst and a 50 nm $Al_2O_3$ barrier layer. The CNTs are narrow and about 240 µm in vertical height. The compactness of the CNT film stems from the thin film of Fe (~5 nm) on top of the $Al_2O_3$ barrier layer. The growth time for the 240 µm tall CNTs was only 2 hrs. It follows that uses of the method 200 could, in turn, result in 100 to 200 µm tall CNTs, as well.

Figure 9:
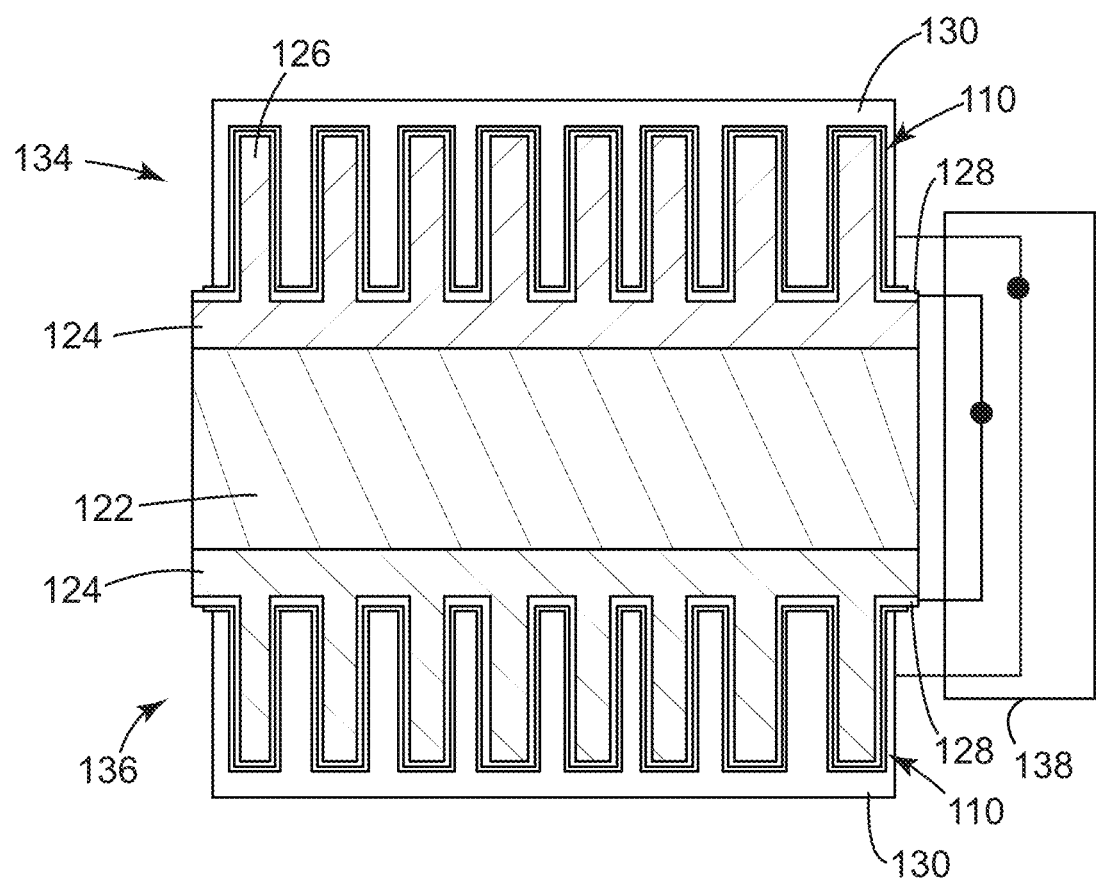
FIG. 9 depicts a schematic diagram of an example of an ordered array of carbon nano-tubes of the capacitor of FIGS. 1 and 6 having structure on two-sides of a substrate of the capacitor of FIGS. 1 and 6. The non-ordered electrode (FIG. 1B) may have similar device structure as well.

FIG. 9 depicts a schematic diagram of an example of the device 102. This example includes a pair of capacitors (e.g., a first capacitor 134 and a second capacitor 136), one each disposed on either side of the silicon base 122, although other base materials might be used in the process. Coupling mechanism 138 may electrically connect the capacitors 134, 136 in parallel. Table 1 below describes functional properties of the device 102, where the laminate 110 has a thickness of 50 nm:

TABLE 1

| Height of the CNTs (µm) | Diameter of the CNTs (nm) | Capacitance µF/cm$^2$ | Breakdown field (V/cm) | Estimated areal energy density (J/cm$^3$) for single-sided capacitor | Estimated areal energy density (J/cm$^3$) for double-sided capacitor |
|---|---|---|---|---|---|
| 100 | 50 | 865 | 1 × $10^6$ | 2162.5 | 4325 |
| 150 | 50 | 1297 | 1 × $10^6$ | 3242.5 | 6485 |
| 200 | 50 | 1728 | 1 × $10^6$ | 4320 | 8640 |
| 100 | 50 | 865 | 2 × $10^6$ | 8650 | 17300 |

TABLE 1-continued

| Height of the CNTs (μm) | Diameter of the CNTs (nm) | Capacitance μF/cm² | Breakdown field (V/cm) | Estimated areal energy density (J/cm³) for single-sided capacitor | Estimated areal energy density (J/cm³) for double-sided capacitor |
|---|---|---|---|---|---|
| 150 | 50 | 1297 | $2 \times 10^6$ | 12970 | 25940 |
| 200 | 50 | 1728 | $2 \times 10^6$ | 17280 | 34560 |

The discussion turns next to another example of the capacitor 100. As noted herein, form factors for the ordered structure 126 may vary as necessary to improve performance of the capacitor 100. These form factors may include elements that perforate one or more surfaces of the substrate 104. Like CNTs, this "nano-perforation" significantly increases the surface area of the substrate 104 and can receive the conformal coating of dielectric laminate 110.

Figure 10:
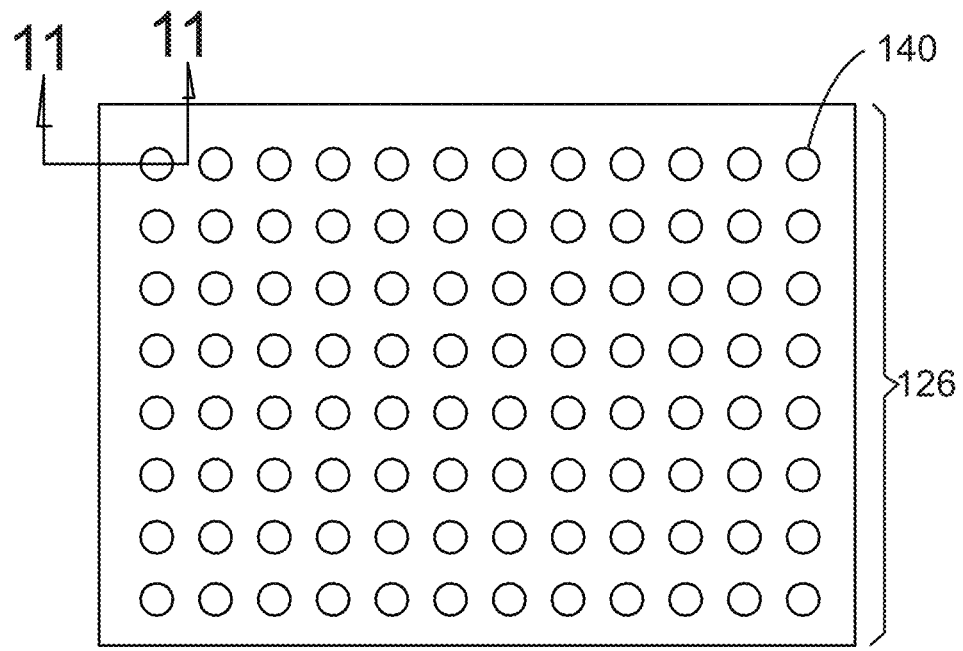
FIG. 10 depicts a plan view from the top of an example of the capacitor of FIG. 1.

FIG. 10 depicts an example of structure to effectuate this nano-perforated design for the capacitor 100. In this example, the ordered structures 126 may embody apertures 140 that penetrate into the base 122, which may be aluminum. The apertures 140 may populate all or part of the top (or bottom) of the aluminum base 122. This arrangement may employ spacing and pitch between adjacent apertures 140 of various dimensions. However, it may benefit the design (or be subject to manufacture constraints) to arrange the apertures 140 with uniform spacing in one or more directions along the surface of the substrate 104.

Figure 11:
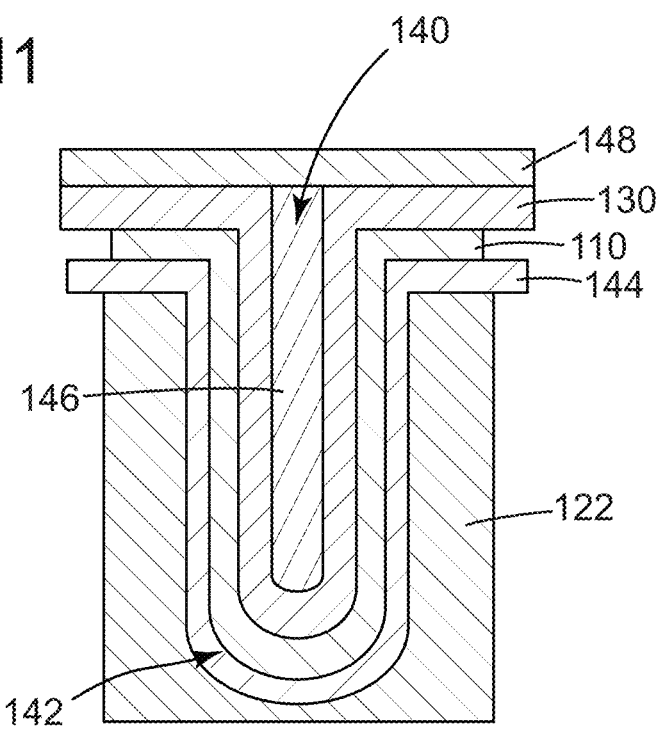
FIG. 11 depicts an elevation view for the cross-section of the example of FIG. 10.

FIG. 11 depicts an elevation view of the cross-section of the example of FIG. 10. The apertures 140 may embody "blind" holes that terminate at a closed end 142. But some designs may also benefit from "through" holes that penetrate the entire thickness of the aluminum base 122 to form a pair of open ends. In one implementation, the structure may also include an intermediary contact layer 144 that interposes between the aluminum base 122 and the dielectric layer 110 that conformally coats the holes 140. The top contact layer 130 may reside on the dielectric layer 110. In one example, the top contact layer 130 may comprise material that fills any interstitial spacing of the hole, as identified by the cross-hatched area enumerated by the numeral 146. The capacitor 100 may also include a prep layer 148, like silver paste or other material that resides on the top contact layer 130. These materials can prepare the device for post-process steps (e.g., soldering) or, more generally, to receive contacts, terminals, or other discrete electrical components.

FIG. 12 depicts a diagram of manufacturing steps for a method 300 that may result in an example of the capacitor 100 with apertures 140. The method 300 may include, at stage 302, forming the aluminum substrate, at stage 304, forming the apertures 140 and metalizing the same, and at stage 306, preparing the capacitor 100 for post-processes.

At stage 302, the method 300 may affix the Al layer 132 onto the silicon substrate. This step may grow or deposit the Al film; however, in one implementation, the aluminum layer may alternatively consist of aluminum foil that adheres (using adhesive) to a surface of the silicon substrate. Thickness for the aluminum layer may correspond with a desired depth for the troughs 140, for example, from about 100 μm to about 350 μm. To increase surface area, the Al layer 132 may be found on multiple surfaces (e.g., top and bottom) of the silicon substrate.

The stage 302 may also include steps to anodize the Al layer 132 to form the troughs 140. These steps may provide a well-ordered, uniform arrangement of the troughs 140. In one implementation, the first step of the process may require dipping at least part of the silicon substrate into a bath of 0.3 M oxalic acid at 15° C. at 40V with aluminum as the anode and platinum as the cathode. The substrate may remain for a period until half of the aluminum converts into alumina. The second step of the process may immerse the partially-anodized aluminum-on-silicon substrate into a bath of chromic acid and phosphoric acid (at 60° C.). This bath can remove any porous alumina that forms during the first step. The process may also repeat the first step to anodize any remaining aluminum. In one implementation, the process may include steps to adjust dimensions for the troughs 140, for example, by treating the anodized silicon substrate in 5 wt % phosphoric acid.

At stage 304, the method 300 may deposit various layers into the apertures 140. This stage may include steps to add the intermediary or "back" contact layer 144, typically Cu deposited using electroplating. The stage also includes steps to add the conformal laminate 110. As noted above, atomic layer deposition (ALD) may prove beneficial for this purpose, but other processes may work as well, for example, sputtering, chemical vapor deposition (CVD), molecular beam epitaxy (MBE), etc. The steps may deposit porous platinum (Pt) as the top contact layer 146, for example, by electroless electroplating. This process may convert [PtCl₂ (tly)2] precursor in toluene at 80° C. into a nanoporous, electrically conductive Pt film on the dielectric laminate 110. Alternatively, ALD techniques may deposit metal, metal-like or transparent conductor material to form the top contact layer 146.

At stage 306, the method 300 may deposit solder paste onto the device. This stage may also include other post-processing steps, for example, steps to attach peripheral or discrete electronics devices to the capacitor 100. These steps may prepare the device for additional packaging operations, like overmolding or mounting one or more of the capacitor 100 into or as part of a bigger assembly.

In light of the foregoing discussion, the improvements herein result in ultra-high capacitance solid state capacitors that may reliably replace battery storage. These devices include very high surface area electrodes in a small footprint. These electrodes may comprise nano-structures, like nano-tubes or nano-holes. A specialized dielectric resides on the structures and between the electrodes. This dielectric may embody a conformal coating or laminate with material layers, each made of materials with very high dielectric constant and dielectric strength. Thickness of this laminate balances any tradeoff between capacitance and breakdown voltage.

Manufacture of the embodiments herein may include steps for forming carbon nano-tubes or nano-holes on a substrate; conformally coating the carbon nano-tubes or nano-holes with a dielectric laminate; metalizing the carbon nano-tubes or nano-holes with conducting material that interposes between the carbon nano-tubes or nano-holes and the dielectric laminate; metalizing the dielectric laminate; depositing aluminum on the substrate; etching the aluminum to form a template for the carbon nano-tubes; and depositing aluminum oxide in the template.

This written description uses examples to disclose the invention, including the best mode, and also to enable any person skilled in the art to practice the invention, including making and using any devices or systems and performing any incorporated methods. An element or function recited in the singular and proceeded with the word "a" or "an" should be understood as not excluding plural said elements or functions, unless such exclusion is explicitly recited. References to "one embodiment" of the claimed invention should not be interpreted as excluding the existence of additional embodiments that also incorporate the recited features. Furthermore, the claims are but some examples that define the patentable scope of the invention. This scope may include and contemplate other examples that occur to those skilled in the art. Such other examples are intended to be within the scope of the claims if they have structural elements that do not differ from the literal language of the claims, or if they include equivalent structural elements with insubstantial differences from the literal language of the claims.

Examples appear below that include certain elements or clauses one or more of which may be combined with other elements and clauses describe embodiments contemplated within the scope and spirit of this disclosure.

What is claimed is:

1. A capacitor, comprising:
   a base material;
   carbon nano-tubes disposed on the base material, each forming a body that extends from the base material;
   a metal layer disposed on the body of the carbon nano-tubes;
   a non-electrolytic conformal coating disposed on the metal layer to cover a majority of the body, the conformal coating filling space between adjacent carbon nano-tubes, the non-electrolytic conformal coating comprising:
      a first layer of material disposed on the metal layer, the first layer comprising alternating layers of an insulating material and a semiconductor material; and
      a second layer of material disposed on a last one of the alternating layers of the first layer, the second layer comprising an insulating material; and
   a conductive material disposed on the non-electrolytic conformal coating, the conductive material filling all remaining space not filled by the non-electrolytic conformal coating between adjacent carbon nano-tubes.

2. The capacitor of claim 1, wherein the conformal coating comprises a first coating and a second coating, each comprising the first layer of material and the second layer of material.

3. The capacitor of claim 1, wherein the conformal coating comprises a first coating and a second coating, only one of which comprises the first layer of material and the second layer of material.

4. The capacitor of claim 1, wherein the a non-electrolytic conformal coating comprises a third layer of material disposed on the second layer of semi-conductive material and that is different from the second layer of semi-conductive material.

5. The capacitor of claim 1, wherein the a non-electrolytic conformal coating comprises a third layer of insulating material disposed on the second layer of semi-conductive material.

6. The capacitor of claim 1, wherein the first layer of insulating material and the second layer of semi-conductive material have Gibbs free energy within 2% of each other.

7. A capacitor, comprising:
   a base material;
   nano-apertures having an opening on at least one surface of the base material;
   a metal layer disposed in the nano-apertures so as to cover the base material in the nano-apertures;
   a non-electrolytic conformal coating disposed in the nano-aperture, the non-electrolytic conformal coating comprising:
      a first layer of material disposed on the metal layer, the first layer comprising alternating layers of an insulating material and a semiconducting material; and
      a second layer of material disposed on a last one of the alternating layers of the first layer, the second layer comprising an insulating material; and
   a conductive material disposed in the nano-aperture, the conductive material filling all space not filled by the non-electrolytic conformal coating in the aperture and also covering the opening.

8. The capacitor of claim 7, wherein the first layer of insulating material and the second layer of semi-conductive material have Gibbs free energy within 2% of each other.

9. The device of claim 7, wherein the a non-electrolytic conformal coating comprises a third layer of insulating material disposed on the second layer of semi-conductive material.

* * * * *